United States Patent
Lien et al.

(10) Patent No.: US 6,560,156 B2
(45) Date of Patent: May 6, 2003

(54) CAM CIRCUIT WITH RADIATION RESISTANCE

(75) Inventors: Chuen-Der Lien, Los Altos Hills, CA (US); Michael J. Miller, Saratoga, CA (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 10/099,913

(22) Filed: Mar. 14, 2002

(65) Prior Publication Data

US 2002/0159320 A1 Oct. 31, 2002

Related U.S. Application Data

(63) Continuation-in-part of application No. 09/781,524, filed on Feb. 8, 2001, now abandoned.

(51) Int. Cl.[7] ................................................. G11C 7/00
(52) U.S. Cl. ........................ 365/222; 365/49; 365/149
(58) Field of Search ............................ 365/222, 49, 149

(56) References Cited

U.S. PATENT DOCUMENTS

| | | | |
|---|---|---|---|
| 3,665,422 A | | 5/1972 | McCoy et al. |
| 4,779,226 A | | 10/1988 | Haraszti |
| 4,791,606 A | | 12/1988 | Threewitt et al. |
| 5,184,325 A | * | 2/1993 | Lipovski ................... 365/222 |
| 5,561,429 A | | 10/1996 | Halberstam et al. |
| 5,572,460 A | | 11/1996 | Lien |
| 5,642,320 A | | 6/1997 | Jang |
| 5,724,296 A | * | 3/1998 | Jang ........................ 365/222 |
| 5,796,671 A | | 8/1998 | Wahlstrom |
| 6,067,656 A | | 5/2000 | Rusu et al. |
| 6,421,265 B1 | * | 7/2002 | Lien et al. .................. 365/49 |
| 6,430,073 B1 | * | 8/2002 | Batson et al. .............. 365/149 |

* cited by examiner

*Primary Examiner*—Huan Hoang
(74) *Attorney, Agent, or Firm*—Bever, Hoffman & Harms, LLP

(57) ABSTRACT

A CAM circuit including a RAM array, a CAM array, and a control circuit that systematically writes data from the RAM array to the CAM array, thereby preventing soft errors by continually restoring data that has been corrupted by radiation. The RAM and CAM arrays can be formed on the same substrate, but are preferably fabricated on separate substrates and mounted in a single package or on a PCB. Both the CAM and RAM can be formed using any conventional memory type (e.g., SRAM, DRAM, NVRAM), and the CAM array can be a binary, ternary, or quad CAM array. The CAM and RAM arrays can be formed on different substrates, or the same substrate. A system including an SRAM ternary CAM array and a RAM array perform quad CAM functions by performing read functions utilizing only the RAM array, while performing lookup functions using the ternary CAM array.

22 Claims, 6 Drawing Sheets

CAM CIRCUIT WITH RADIATION RESISTANCE

RELATED APPLICATIONS

The present application is a continuation-in-part of commonly owned U.S. patent application Ser. No. 09/781,524, "DRAM CIRCUIT WITH SEPARATE REFRESH MEMORY" filed Feb. 8, 2001 now abandoned by Chuen-Der Lien and Chau-Chin Wu.

FIELD OF THE INVENTION

The present invention relates to integrated circuit memory devices, and in particular to content addressable memory (CAM) arrays.

DISCUSSION OF RELATED ART

Conventional random access memory (RAM) arrays include RAM cells (e.g., static RAM (SRAM) cells, dynamic RAM (DRAM) cells, and non-volatile RAM (NVRAM) cells) that are arranged in rows and columns, and addressing circuitry that accesses a selected row of RAM cells using address data corresponding to the physical address of the RAM cells within the RAM array. A data word is typically written into a RAM array by applying physical address signals to the RAM array input terminals to access a particular group of RAM cells, and applying data word signals to the RAM array input terminals that are written into the accessed group of RAM cells. During a subsequent read operation, the physical address of the group of RAM cells is applied to the RAM array input terminals, causing the RAM array to output the data word stored therein. Groups of data words are typically written to or read from the RAM array one word at a time. Because a relatively small portion of the entire RAM array circuitry is activated at one time to perform each data word read/write operation, a relatively small amount of switching noise within the RAM array, and the amount of power required to operate a RAM array is relatively small.

In contrast to RAM arrays, content addressable memory (CAM) arrays include memory cells (e.g., SRAM cells, DRAM cells, or NVRAM cells) in response to their content, rather than by a physical address. Specifically, a CAM array receives a data value that can be compared with all of the data words stored in the CAM array. In response to each unique data value applied to the CAM array input terminals, the rows of CAM cells within the CAM array assert or de-assert associated match signals indicating whether or not one or more data values stored in the CAM cell rows match the applied data value. Because large amounts of data can be searched at one time, CAM arrays are often much faster than RAM arrays in certain systems, such as search engines.

While CAM arrays are faster than RAM arrays in performing search functions, they consume significantly more power and generate significantly more switching noise than RAM arrays. In particular, in contrast to RAM arrays in which only a small portion of the total circuitry is accessed during each read and write operation, significantly more power is needed (and noise is generated) in a CAM array because a relatively large amount of circuitry is accessed during each lookup operation.

To reduce the total power consumed by CAM arrays, there is a trend toward producing CAM arrays that operate on low system voltages. To facilitate lower voltages, the integrated circuit (IC) fabrication technologies selected to produce such CAM arrays utilize smaller and smaller feature sizes. In general, the smaller the feature size of an IC, the lower the system voltage that is used to operate the IC. However, when IC feature sizes and system voltages are reduced too much, the amount of charge stored at each node within the CAM array becomes so small that a soft error problem arises, which is discussed below with reference to FIG. 1.

FIG. 1 is a simplified cross sectional view showing an N-type diffusion (node) 50 formed in P-type well (P-WELL) 51, which is exemplary of a typical IC feature (e.g., a drain junction utilized to form an N-type transistor). Dashed line capacitor 52 represents the capacitance of node 50, and indicates that node 50 stores a positive charge.

As indicated in FIG. 1, if an energetic particle, such as an alpha-particle ($\alpha$), from the environment or surrounding structure strikes the N-type diffusion of node 50, then electrons (e) and holes (h) will be generated within the underlying body of semiconductor material (i.e., in P-well 51). These free electrons and holes travel to the node 50 and P-well 51, respectively, thereby creating a short circuit current that reduces the charge stored at node 50. If the energy of the alpha-particle is sufficiently strong, or if the capacitance 52 is too small, then node 50 can be effectively discharged. When node 50 forms a drain in an SRAM cell and the charge perturbation is sufficiently large, the stored logic state of the SRAM cell may be reversed (e.g., the SRAM cell can be flipped from storing a logic "1" to a logic "0"). This is commonly referred to as a "soft error" because the error is not due to a hardware defect and the cell will operate normally thereafter (although it may contain erroneous data until rewritten).

Soft errors also arise due to other mechanisms, such as switching noise. As discussed above, switching noise is significantly higher in CAM arrays than in conventional RAM arrays, thereby making the problem of soft errors even greater in CAM arrays.

Many approaches have been proposed for dealing with soft errors, such as increased cell capacitance or operating voltage, and error detection schemes (such as using one or more parity bits). While these proposed approaches are suitable for standard RAM arrays, they are less desirable in CAM arrays. As pointed out above, CAM arrays inherently consume more power than RAM arrays. Therefore, while increased cell size and/or operating voltage can be tolerated in a RAM array, such solutions are less desirable in a CAM arrays. Moreover, adding error detection schemes to CAM arrays increase the size (and, hence, the cost) of the CAM arrays, and further increase power consumption.

Accordingly, what is needed is a memory system that addresses the soft error problem associated with a CAM array of the system without greatly increasing the cost and power consumption of the CAM array.

SUMMARY

The present invention is directed to a memory circuit including a CAM array, a RAM array, and a control circuit that coordinates the operation of the CAM array and RAM array such that data stored in the CAM array is systematically refreshed using data read from the RAM array. The control circuit receives operation requests (e.g., read, write, or lookup (search) operations), and transmits corresponding data and/or control signals to the RAM and CAM arrays. In accordance with an aspect of the present invention, data values written to selected CAM cells of the CAM array are also written to corresponding memory cells of the RAM array. Subsequently, the control circuit systematically refreshes the selected CAM cells by reading the data values from the corresponding memory cells of the RAM array, and then writing the data values to the corresponding CAM cells. By frequently refreshing the CAM array using data read from the RAM array, soft errors in the CAM array are essentially eliminated because erroneous data values arising from, for example, alpha-particle strikes, are immediately corrected during the next refresh operation. Further, because the present invention avoids the need to incorporate a soft error prevention scheme into the CAM array, the cost of fabricating the CAM array is reduced.

In accordance with another aspect of the present invention, during data read operations, data values are only read from the RAM array (i.e., not from the CAM array). By reading data values only from the RAM array, operation of the CAM array is greatly simplified. Lookup operations are preformed by the CAM array in a conventional manner.

In accordance with alternative embodiments of the present invention, the memory circuit is integrally fabricated on a single substrate (e.g., silicon chip), or the CAM and RAM arrays are fabricated as separate devices that communicate through interface circuits. When the RAM array is designed using a soft error prevention scheme that utilizes parity bits and the memory cells in the CAM and RAM arrays are the same size, then the RAM and CAM arrays may be fabricated on a single chip to minimize assembly costs. However, when the RAM array utilizes a soft error prevention scheme based on high voltage and/or larger cell capacitance (i.e., the memory cell size of the RAM array is larger than the memory cells utilized in the CAM array), then the RAM and CAM arrays may be beneficially fabricated on separate chips to minimize fabrication costs. Further, fabricating the CAM array and RAM array separately may significantly increase fabrication yields, thereby reducing the total cost of the memory circuit. In one embodiment utilizing separate chips for the CAM and RAM arrays, the separate chips are mounted in a single package and connected, for example, using a flip-chip arrangement. In another embodiment, the CAM array and RAM array chips are separately packaged and connected via conductive traces formed on a printed circuit board.

In accordance with another aspect of the present invention, binary, ternary, and quad (four state) CAM circuits are implemented by combining binary or ternary CAM arrays with appropriately sized RAM arrays. In one example, a 9 Megabyte binary CAM array is combined with a 9 Megabyte RAM array to produce a binary CAM circuit that stores logic "1" or logic "0" data values in each CAM cell in accordance with corresponding data stored in an associated memory cell of the RAM array. In another example, a 9 Megabyte ternary CAM array is combined with an 18 Megabyte RAM array (or two 9 Megabyte RAM arrays) to produce a ternary CAM circuit that stores a logic "1", a logic "0", or a "don't care" data value in each CAM cell in accordance with corresponding data stored in an associated pair of memory cells of the RAM array. In yet another example, a quad CAM circuit is implemented using a 9 Megabyte CAM array, which is modified to include a translation circuit, and an 18 Megabyte RAM array (or two 9 Megabyte RAM arrays). The translation circuit writes a logic "1" or a logic "0" on in the ternary CAM cell in accordance with a data value stored in an associated first memory cell of the RAM array when an associated second (mask) memory cell of the RAM array indicates a "no mask" state. Conversely, when the second memory cell indicates a "mask" state, the translation circuit writes a "don't care" data value into the associated ternary CAM cell no matter what data value is stored in the first memory cell. Accordingly, the data value (logic "1" or logic "0") for each CAM cell is retained in the RAM array even when the data value is masked in the CAM array.

In accordance with another aspect of the present invention, the CAM array and PAM array may store data values using memory cells that are based on the same or different cell types. For example, the CAM array and RAM array may both utilize SRAM memory cells to store data values, or both include DRAM memory cells. Alternatively, the CAM array may utilize SRAM memory cells and the RAM array may utilize DRAM memory cells, or the CAM array may utilize DRAM memory cells and the RAM array utilize SRAM memory cells. Moreover, one or both of the CAM and RAM memory cells may include an EEPROM or any other type of non-volatile memory cells.

The present invention will be more fully understood in view of the following description and drawings.

DETAILED DESCRIPTION

Figure 1:
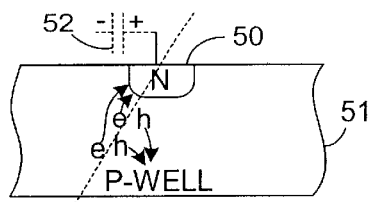
FIG. 1 is simplified cross sectional view showing a node of an IC device.
Figure 2:
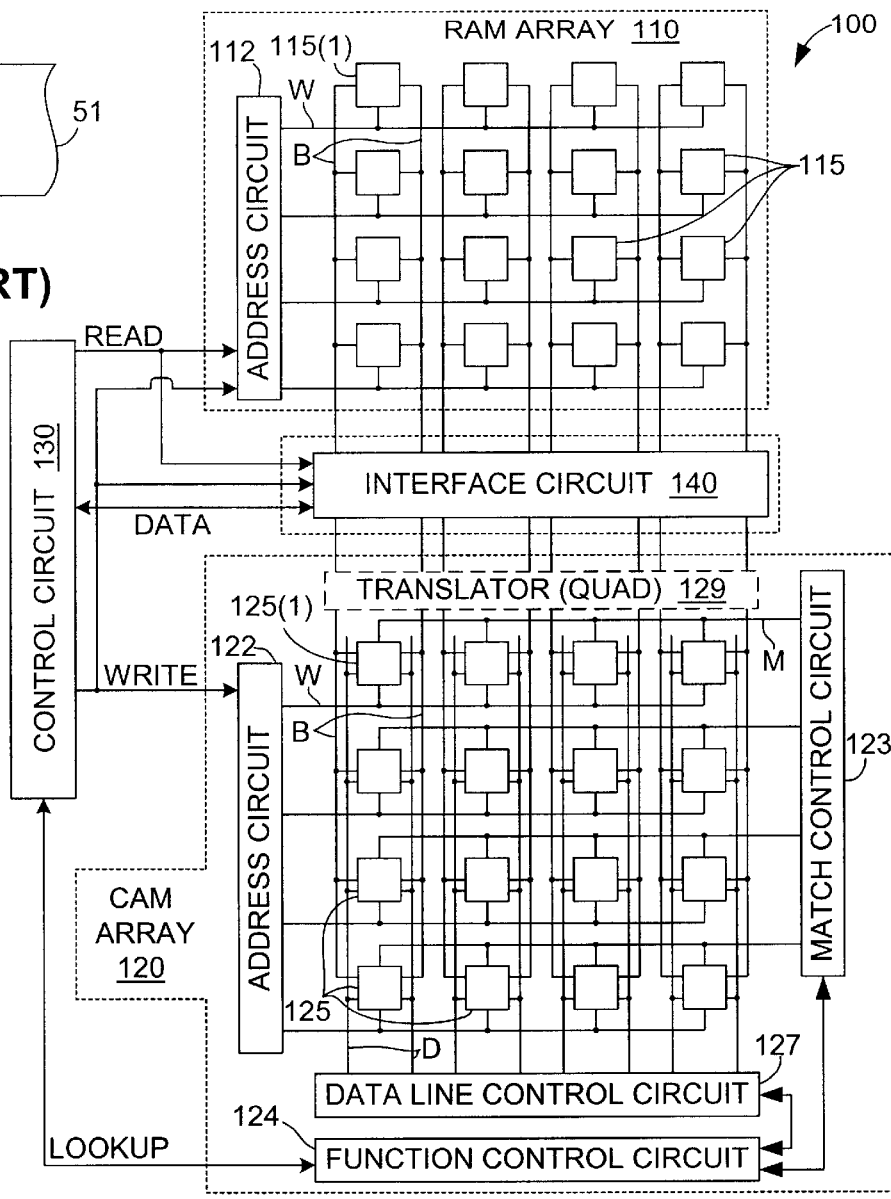
FIG. 2 is a block diagram showing a simplified memory circuit in accordance with the present invention.

FIG. 2 is a block diagram showing a simplified CAM (memory) circuit 100 in accordance with a general embodiment of the present invention. CAM circuit 100 includes a RAM array 110, a CAM array 120, a control circuit 130, and an interface circuit 140 that facilitates data communication between RAM array 110, CAM array 120, and control circuit 130. Each of these circuits is discussed in additional detail below.

RAM array 110 includes memory cells 115 that are arranged in rows and columns, and are coupled to an address circuit 112 and to interface circuit 140. Each row of memory cells 115 is connected to an associated write line W, and is addressed during read and write operations by an address signal transmitted from address circuit 112 in accordance with known techniques. Each column of memory cells 115 is connected to one or more associated bit lines B, which are used to transmit data values to and from interface circuit 140 in the manner described below. As discussed in additional detail below, each memory cell 115 can be an SRAM cell, a DRAM cell, or a non-volatile memory cell (e.g., an EEPROM).

CAM array 120 includes CAM cells 125 that are also arranged in rows and columns. Each row of CAM cells 125 is connected to an address circuit 122 by an associated write line W, and is addressed during write operations by an address signal transmitted from address circuit 127 in accordance with known techniques. Each row of RAM cells 125 is also connected to a match line control circuit 123 by an associated match line M, which is controlled by a function circuit 124 during lookup and write operations (described below). Each column of CAM cells 125 is coupled to interface circuit 140 by one or more associated bit lines B, which are used to transmit data values from interface circuit 140 to rows of memory cells addressed by address circuit 122. An optional translator circuit 129 is connected between bit lines B and interface circuit 140 when CAM array 120 implements quad (four state) CAM functions (translator circuit 129 is described in additional detail below). In addition, each column of CAM cells 125 is connected to a data line control circuit 127 via one or more associated data lines D, which is controlled by function control circuit 124 and used to transmit data values to CAM cells 125 during lookup operations.

In accordance with an aspect of the present invention, each CAM cell 125 of CAM array 120 is associated with one or more memory cells 115 of RAM array 110. In one embodiment, each CAM cell 125 includes only one memory cell (e.g., CAM array 110 is a binary CAM array), and RAM array 110 includes one memory cell 115 for each CAM cell 125. For example, a CAM array 120 including 9 Megabytes of binary CAM cells 125 is combined with a 9 Megabyte RAM array 110 to produce a binary CAM circuit 100. In contrast, when each CAM cell 125 includes more than one memory cell (e.g., when CAM array 110 is a ternary or quad CAM array), then RAM array includes two memory cells 125 for each CAM cell 125. For example, a CAM array 120 including 9 Megabytes of ternary or quad CAM cells 125 is combined with an 18 Megabyte RAM array (or two 9 Megabyte RAM arrays).

Referring to the left side of FIG. 2, control circuit 130 is coupled to RAM array 110, CAM array 120, and interface circuit 140, and controls these circuits during the operation of CAM circuit 100. In particular, control circuit 130 transmits control and address signals to these circuits, and coordinates data transmissions to and from these circuits during read, write, and lookup operations in the manner described in detail below. In one embodiment control circuit 130 is implemented by a microprocessor, ASIC, or programmable logic device (PLD) that is fabricated on a separate substrate (e.g., silicon chip) and connected by suitable conductive paths to RAM array 110, CAM array 120, and interface circuit 140. In another embodiment, control circuit 130 is implemented by logic circuitry integrally formed on the same substrate with RAM array 110, CAM array 120, and/or interface circuit 140.

In accordance with an aspect of the present invention, during write operations, control circuit 130 generates an appropriate write command signal and associated address signal (WRITE) that are transmitted to RAM array 110, CAM array 120, and interface circuit 140 such that each associated pair of CAM/memory cells store the same data value. For example, assuming memory cell 115(1) is associated with a binary CAM cell 125(1), then a data value written to memory cell 115(1) is also written to CAM cell 125(1). In one embodiment, RAM array 110 and CAM array 120 are arranged such that an address generated by control circuit 130 accesses the associated cells in both arrays. For example, if an address value "00" transmitted from control circuit 130 to address circuit 112 of RAM array 110 addresses the row containing memory cell 115(1), then the same address value "00" transmitted to address circuit 122 of CAM array 120 addresses the row containing CAM cell 125(1). Accordingly, a data word "1000" written to address "00" of both RAM array 110 and CAM array 120 will result in a logic "1" being stored in both memory cell 115(1) and binary CAM cell 125(1). In other embodiments, an address conversion may be utilized in one of RAM array 110 and CAM array 120 to simultaneously address both associated cells. In one embodiment, the particular row of RAM cells 115 and CAM cells 125 addressed during the write operation is controlled by a counter provided in address circuits 112 and 122, respectively. In another embodiment, write operations are performed by writing new data values only to RAM array 110, which then writes the new data values to CAM array 120 during a refresh operation (discussed below).

When CAM circuit 100 receives a lookup (search) instruction, control circuit 130 transmits a lookup command signal (LOOKUP) to CAM array 120, which includes the data value sought and, in some cases, a range of addresses to be searched. In particular, this information is transmitted to function control circuit 124, which controls match line control circuit 123 and data line control circuit 127 such that the sought-for data value is applied to data lines D, and lookup (match) results are transmitted from match control circuit 123 via function control circuit 124 to control circuit 130. The operation of each CAM cell 125 during lookup operations is described below.

In accordance with another aspect of the present invention, command circuit 130 systematically refreshes CAM array 120 using corresponding data values read from RAM array 110. Each refresh operation involves reading all data values stored in RAM cells 115 of RAM array 110, and then writing the data values to the corresponding CAM cells in CAM array. For example, referring to FIG. 2, a data value read from RAM cell 115(1) is written to its associated CAM cell 125(1) during each refresh operation. In one embodiment, a first row of RAM cells 115 is read and then written to a corresponding first row of CAM cells 125, then a second row, and so on, until all data values stored in CAM array 120 are refreshed. The process of sequentially refreshing selected rows CAM array 120 is referred to herein as a refresh operation or refresh cycle. The term "systematically" is used herein to indicate that each refresh operation is either performed according to a predetermined schedule, or is performed in response to a predetermined event. For example, in one embodiment the refresh operation is continuously performed such that, upon completing one refresh cycle, a new refresh cycle is immediately initiated, thereby refreshing CAM array 120 as often as possible to minimize the chance of a soft error resulting in an erroneous lookup operation. In another embodiment, a fixed time delay may be inserted between each refresh operation (e.g., to allow for read or write operations, if necessary). In yet another embodiment, the refresh operation may be initiated before each lookup operation. Refresh operations are described in additional detail below with reference to the specific embodiments.

By systematically refreshing CAM array 120 using data read from RAM array 110, soft errors caused, for example, by alpha particles striking the memory cells of CAM array 120 are essentially eliminated because the resulting erroneous data values are immediately corrected during the next refresh operation. Further, because the present invention avoids the need to incorporate a soft error prevention scheme into CAM array 120, the cost of fabricating CAM array 120 is reduced.

In accordance with another aspect of the present invention, when CAM circuit 100 receives a read instruction, control circuit 130 transmits a read command (READ) signal only to RAM array 110, which includes an address (or address range) of the data word (or words) to be read. In conventional CAM circuits, data must be read from the CAM array, which requires that the CAM array include specific circuitry that supports such read operations. Because the data values stored in RAM array 110 are essentially identical to those stored in CAM array 120, read operations are performed by reading data values from RAM array 110, thereby allowing CAM array 120 to exclude specific circuitry needed to support read operations.

Figure 3A:
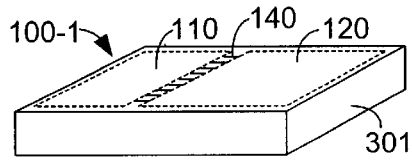
FIGS. 3(A), 3(B) and 3(C) are perspective views depicting the memory circuit of FIG. 2 according to various embodiments of the present invention
Figure 3B:
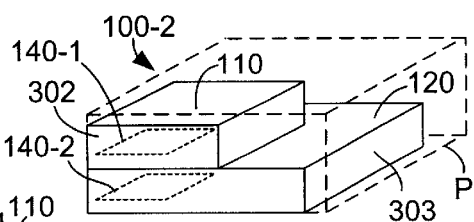
Figure 3C:
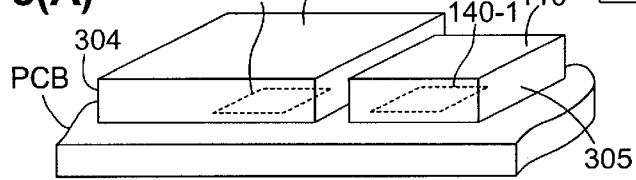

Interface circuit 140 is provided to store (register) data values transmitted between RAM array 110, CAM array 120, and control circuit 130. Interface circuit 140 can either be a single circuit connected between RAM array 110 and CAM array 120, or separated into one or more components that are connected, for example by a bus. For example, FIG. 3(A) shows a CAM system 100-1 in which RAM array 110 and CAM array 120 are integrated on a single substrate (i.e., simultaneously fabricated on substrate 301). In this embodiment, interface circuit 140 can be a single circuit linking the two arrays. However, as shown in FIGS. 3(B) and 3(C), interface circuit 140 may comprise two or more sections when RAM array 110 and CAM array 120 are fabricated on separate substrates. For example, FIG. 3(B) shows a CAM circuit 100-2 in which RAM array 110 and CAM array 120 are fabricated on substrates 302 and 303, respectively, and include interface circuit portions 140-1 and 140-2, respectively. Note that RAM array 110 and CAM array 120 are mounted in a single package P, and are connected using a "flip-chip" arrangement. FIG. 3(C) shows another embodiment in which a CAM circuit 100-3 includes RAM array 110 and CAM array 120 fabricated on substrates 304 and 305, respectively, and mounted on a printed circuit board (PCB) including conductive traces that form a bus facilitating communication between interface circuits 140-1 and 140-2, which include conventional input/output (I/O) circuitry. The examples shown in FIGS. 3(A) through 3(C) are intended to be exemplary, and not limiting.

The alternative embodiments shown in FIGS. 3(A) through 3(C) establish that CAM circuits according to the present invention may be formed integrally, or a separate devices that are linked, for example, using a bus. While forming both RAM array 110 and CAM array 120 on a single substrate facilitates a smaller circuit, several advantages are provided when RAM array 110 and CAM array 120 are fabricated on separate substrates (e.g., as shown in FIGS. 3(B) and 3(C)). For example, due to their relatively low switching noise and power consumption, fabricating RAM arrays on separate substrates allows the use of relatively high system voltages to avoid soft errors, while the separate CAM arrays can be formed using relatively low system voltages.

In addition to being formed using the various substrate arrangements shown in FIGS. 3(A) through 3(C), the CAM circuits of the present invention can be formed using any CAM array type, or utilizing any combination of memory technologies, as set forth in the following examples.

Figure 4:
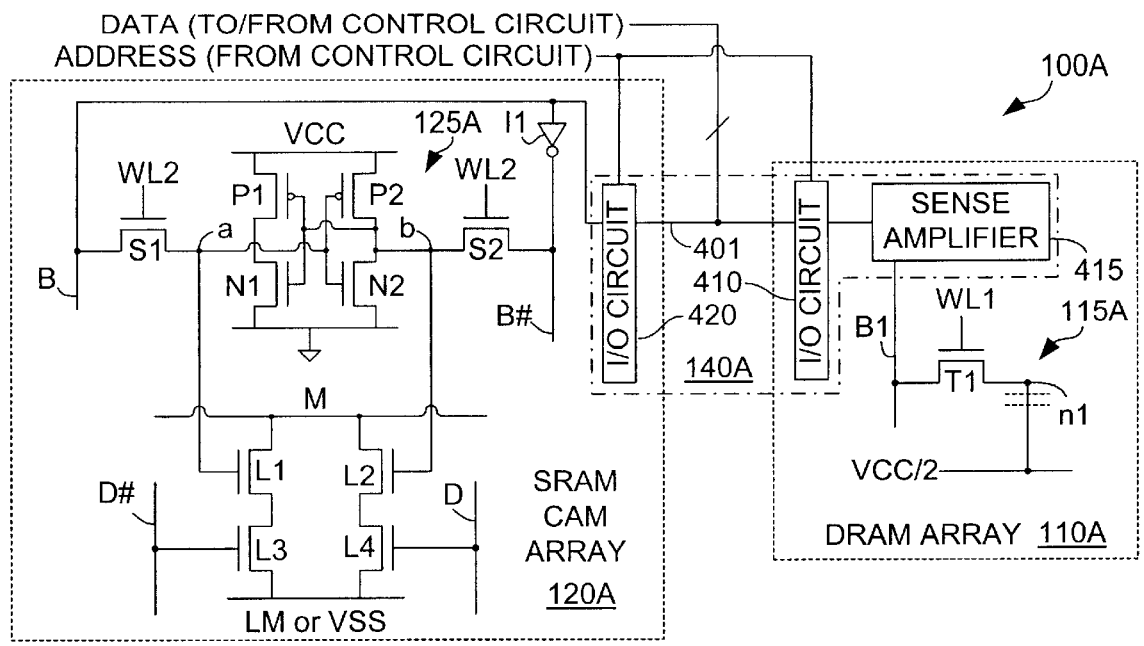
FIG. 4 is a simplified schematic diagram showing a portion of a binary CAM circuit according to a first specific embodiment of the present invention.

FIG. 4 is a simplified circuit diagram showing portions of a binary CAM circuit 100A in accordance with a first specific embodiment of the present invention. Consistent with generalized CAM circuit 100 (shown in FIG. 2), CAM circuit 100A includes a DRAM RAM array (device) 110A, and an SRAM CAM array (device) 120A that are connected by a data bus 401. Portions of CAM circuit 100A that are not required for explanatory purposes are omitted for brevity.

Referring to the right side of FIG. 4, DRAM array 110A includes an array of conventional DRAM memory cells 115A (one shown) that are arranged in rows and columns (as shown in FIG. 2). Each DRAM memory cell 115A includes a transistor T1 having a gate terminal connected to an associated word line (e.g., word line WL1) which is controlled by address circuit 112 (see FIG. 2), a first terminal connected to an associated bit line (e.g., bit line B1), and a second terminal connected to a signal source (e.g., VCC/2 or ground). Data values written to each DRAM memory cell 115A are stored at a storage node n1, which includes a capacitor (indicated by dashed parallel plates) that is formed between the second terminal of transistor T1 and the signal source for temporarily storing the data value according to known DRAM techniques.

Referring to the central portion of FIG. 4, interface circuit 140A includes a sense amplifier 405 that is connected to bit line B1 of DRAM array 110A, a first I/O circuit 410 also provided on DRAM array 110A, and a second I/O circuit 410 provided on DRAM CAM array 120A. Sense amplifier 405 senses the data value stored at node n1 of DRAM memory cell 115A during read operations and during the read phase of the refresh operation in accordance with known techniques. The sense amplifier then amplifies the sensed data value (e.g., to VCC when a logic "1" is detected, or ground/zero volts when a logic "0" is detected), and the amplified sensed data value is passed to I/O circuit 410, which transmits the data value via data bus to I/O circuit 420 and/or to the control circuit (not shown) using known techniques. I/O circuit 420 is coupled to bit line BE of DRAM CAM array 120A.

Referring to the left side of FIG. 4, in addition to I/O circuit 420, SRAM-based CAM array 120A includes an array of SRAM CAM cells 125A (one shown) that are arranged in rows and columns. Each binary CAM cell 125A that includes a bistable flipflop formed by transistors P1, P2, N1, and N2 that is connected by access transistors S1 and S2 to complementary bit lines B and B# (the symbol "#" is used herein to designate complement), and includes a logic (lookup) circuit formed by transistors L1 through L4. The bistable flipflop formed by transistors P1, P2, N1 and N2 stores a data value (bit) according to known techniques. Access transistors S1 and S2 pass data values from bit lines B and B# to the bistable flipflop circuit during write and refresh operations, and the logic circuit formed by transistors L1 through L4 is utilized during lookup (search) operations, as described below.

During a data write operation, a data value to be stored is written to storage nodes a and b by applying a true (e.g., logic "1" or VCC) data signal and a complement (e.g., logic "0" or ground) data signal to bit lines B and B#, respectively, and then applying a high voltage signal on word line W. The high voltage on word line W turns on access transistors S1 and S2, thereby passing the data signals to storage nodes a and b. The high voltage at node a turns on transistor N2, thereby connecting node b to ground. Similarly, the low voltage at node b turns on transistor P1, thereby connecting node a to VCC. The bistable flipflop circuit formed by transistors P1, P2, N1 and N2 remains latched in this state until an opposite data value is written to storage nodes a and b (e.g., by applying a logic "0" or ground to node a, and a logic "1" or VCC to node b).

Subsequent to storing a data value in DRAM CAM cell 125A, a lookup (search) operation is performed by precharging match line M and transmitting a data value to be compared onto data line D, and the complement of the data value onto inverted data line D#. Note that data lines D and D# may be shared with bit lines B# and B, respectively, but shared arrangement prevents simultaneous lookup and read/write operations. A no-match condition is detected when match line M is discharged to ground through the signal path formed by transistors L1 and L3, or through the signal path formed by transistors L2 and L4. Specifically, when a logic "1" is stored in the bistable flipflop circuit (i.e., a high voltage is stored at node a) and a logic "0" is applied as the compare data value (i.e., a high voltage is transmitted on inverted data line D#), then both transistors L3 and Q4 are turned on to discharge match line M to ground. When a logic "0" on is stored in the bistable flipflop circuit (i.e., a high voltage is stored at node b) and a logic "1" is applied as the compare data value (i.e., a high voltage is transmitted on data line D), then both transistors L2 and L4 are turned on to discharge match line M to ground. Conversely, when a match condition occurs, match line M remains in its precharged state (i.e., no signal path is formed by transistors L1 and L3, or transistors L2 and L4).

Figure 5:
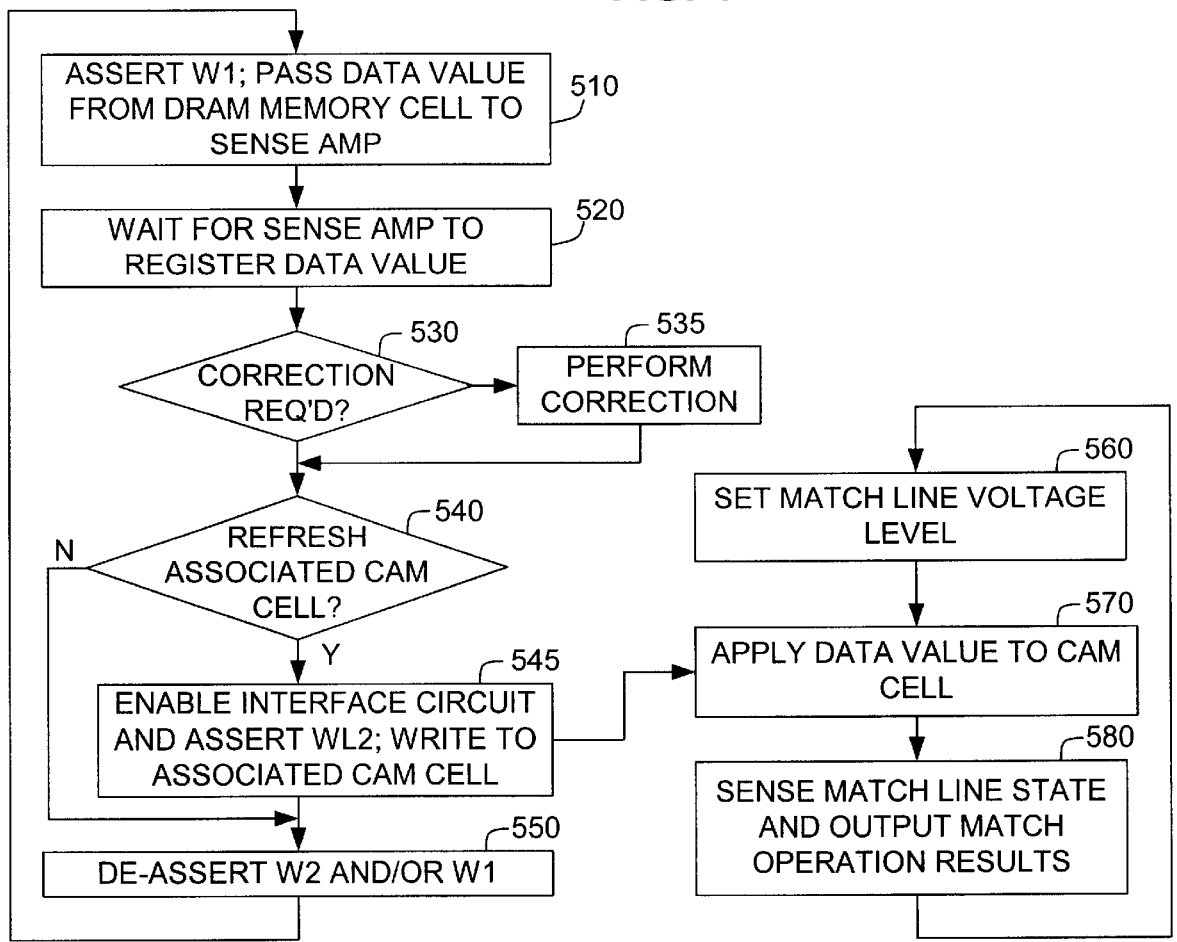
FIG. 5 is a flow diagram showing refresh and match operations that are simultaneously performed by the binary CAM circuit of FIG. 4.

FIG. 5 is a flow diagram showing general steps associated with match and refresh operations of CAM circuit 100A. The steps shown in the left column of FIG. 5 are associated with a refresh operation performed by DRAM array 110A, and the steps shown in the right side of FIG. 5 are associated with a lookup operation that performed by SRAM CAM array 120A.

Referring to the left side of FIG. 5 and to the circuit shown in FIG. 4, the refresh operation begins by accessing a selected DRAM memory cell (e.g., DRAM memory cell 115A) in DRAM memory array 110A by asserting word line WL1 coupled to transistor T1 of selected DRAM memory cell 115A (Block 510 in FIG. 5). The thus turned-on transistor T1 passes the data value at storage node n1 of selected DRAM memory cell 115A onto bit line B1 of DRAM array 110A. Note that, in an actual implementation, asserted word line WL1 also connects other DRAM memory cells (not shown) in the row including the selected DRAM memory cell to their associated bit lines, which are also registered by associated sense amplifiers.

Next, a predetermined time is allowed for sense amplifier 415 to sense and register the data value transmitted on bit line B1 of RAM array 110A (Block 520), thereby refreshing DRAM cell 115A. For example, when sense amplifier 415 senses a logic "1" (which is typically less than VCC due to signal degradation), sense amplifier 415 registers this data value by transmitting a refreshed logic "1" (e.g., VCC) onto bit line B1, which is passed by transistor T1 to node n1. Conversely, when sense amplifier 415 senses a logic "0" (which is typically greater than ground/zero volts), sense amplifier 415 registers this data value by transmitting a refreshed logic "0" (e.g., ground or zero volts) onto bit line B1, which is passed by transistor T1 to node n1. Note that word line WL1 remains turned on while sense amplifier 415 registers the data value, thereby causing the amplified data value to be written back into selected DRAM memory cell 115A via transistor T1 (i.e., DRAM memory cell 115A is "refreshed").

Next, in Block 530, an optional data check is performed (e.g., using parity data provided on DRAM array 110A), and correction is performed if needed (Block 535).

The control circuit then determines whether the CAM cell 125A associated with memory cell 115A is scheduled for refresh (Block 540). In one embodiment, CAM cells of CAM array 120A that do not store meaningful data (e.g., the section of CAM array 120A is currently not being used to store data values) are not refreshed, so control is passed directly to Block 550. The determination of whether meaningful data is stored or not is performed by the control circuit. In another embodiment, a refresh operation may be omitted for other reasons (e.g., scheduling data write operations). In yet another embodiment, all of the CAM cells of CAM array 120A are refreshed during each refresh cycle, whether they stored meaningful data or not, so the result in Block 540 is always Yes (i.e., control is always passed to Block 545).

If associated CAM cell 125A is scheduled for refresh (i.e., if control is passed to Block 545), then interface circuit 140A is enabled to pass the data value read from DRAM cell 115A to bit lines B and B# of CAM array 120A using known techniques, and word line WL2 is enabled. Enabling word line WL2 turns on transistor S1 and S2, which pass the data value and its inverse to storage node a and inverted storage node b, respectively. Accordingly, if the data value stored in SRAM CAM cell 125A is erroneously flipped due to, for example, an alpha-particle strike, then the refresh operation corrects the erroneous data value. Conversely, if the data value stored in SRAM CAM cell 125A is correct, then the refresh operation does not change the stored data value.

Finally, after a predetermined set-up period, word line WL1 (and word line WL2, if asserted) are de-asserted, thereby turning off transistor T1 (and S1 and S2, if turned on) to isolate storage node n1 (and nodes a and b) from bit line B1 (and B and B#, respectively) (Block 550).

Referring to the right column in FIG. 5, while the refresh operation is repeatedly performed, lookup operations are also performed using applied data values transmitted to binary DRAM CAM cell 125A on data lines D and D#. First, match line M and low match line LM are pre-charged in the manner described above (Block 560). Next, an applied data value (and its inverse) is transmitted on data line D (and inverted data line D#) (Block 570). A no-match condition is detected when a signal path is opened between match line M and the low match line LM. In particular, when the applied data value transmitted on inverted data line D# and the data value at storage node a are both logic "1" (i.e., high) data values, then match line M is discharged through the turned-on pass transistors L1 and L3, thereby indicating a no-match condition on match line M. Similarly, a no-match condition is also detected when the applied data value on data line D and the inverted data value stored at inverted storage node b are both high, thereby discharging match line M through the turned-on pass transistors L2 and L4. Finally, the charged/discharged state of match line M is sensed by match line control circuit 123 (see FIG. 2) (Block 580), and the results of the match operation are output through function control circuit 124 (see FIG. 2).

The above refresh operation is repeated in accordance with known techniques in order to refresh DRAM memory cell 115A in DRAM memory array 110A, and to selectively refresh SRAM CAM cell 125A in DRAM CAM array 120A. In addition, lookup operation described with reference to Blocks 560–580 is performed simultaneously with the refresh operation, thereby providing an efficient CAM circuit that is not delayed by refresh operations before performing logic operations.

In addition to match and refresh operations, CAM circuit 110A performs read and write operations as follows. Because the data value stored in DRAM memory cell 115A is identical to that stored in SRAM CAM cell 125A, SRAM CAM cell 125A can be read by reading the data value stored in DRAM memory cell 115A (i.e., by enabling word line W1). During write operations, word lines WL1 and WL2 are simultaneously enabled to write a data value received from control circuit 130 (see FIG. 2) to both DRAM memory cell 115A and DRAM CAM cell 125A.

The present invention is not necessarily limited to SRAM-based binary CAM circuit 100A (shown in FIG. 4). For example, CAM circuits, such as that described below with reference to FIG. 6, may include CAM arrays utilizing logic circuits other than those shown in FIG. 4 to perform lookup functions. Further, as described below with reference to FIGS. 7 through 9, CAM circuits may be formed in accordance with the present invention using CAM arrays and RAM arrays based on other memory types. Further, as described below with reference to FIGS. 10 and 11, ternary CAM circuits and quad CAM circuits may be formed in accordance with the present invention. These additional embodiments are intended to be exemplary and not limiting.

Figure 6:
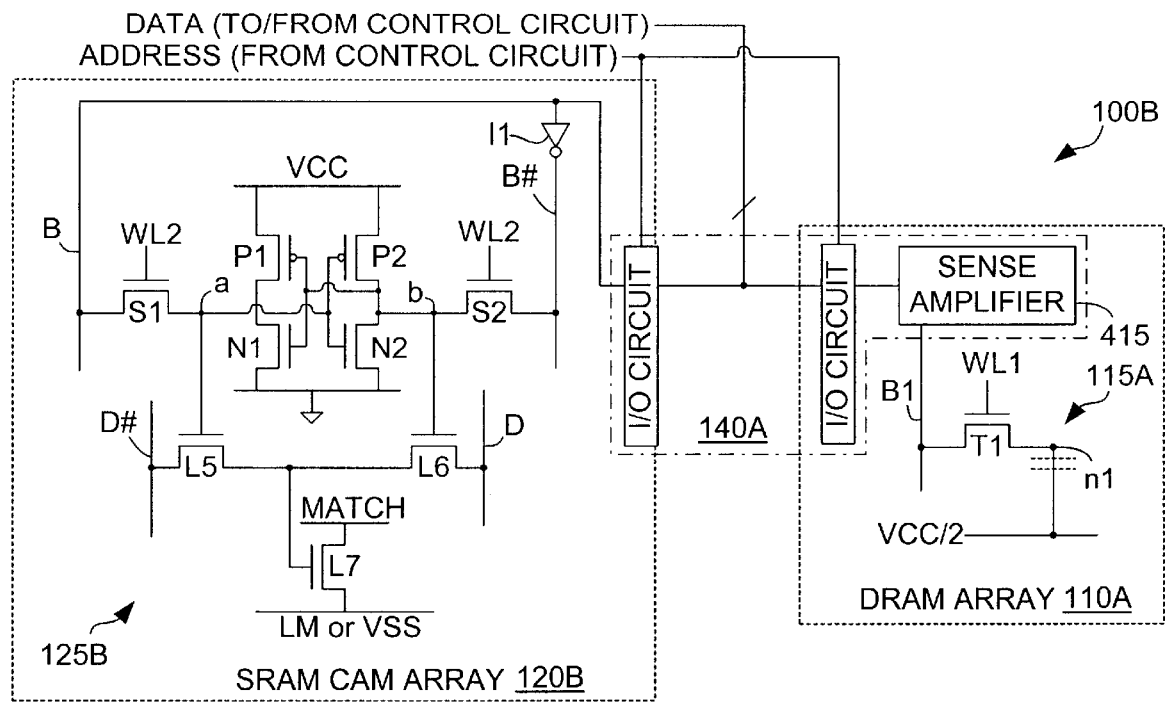
FIG. 6 is a simplified schematic diagram showing a portion of a binary CAM circuit according to a second specific embodiment of the present invention.

FIG. 6 is a simplified schematic diagram showing a portion of a binary CAM circuit 100B including DRAM 110A, which is described above with reference to FIG. 4, and an SRAM-based CAM array 120B. In addition, SRAM-based CAM array 120B includes a bistable flipflop, which is formed by transistors P1, P2, N1, and N2, that is connected to bitlines B and B# by access transistors S1 and S2. CAM array 100B also includes an interface circuit 140A that is essentially identical to that described above with reference to FIG. 4. Because these circuits are described in detail above, description of these circuits is omitted here for brevity.

Referring to the lower left portion of FIG. 6, SRAM-based CAM array 120B differs from CAM array 120A in that it includes a three-transistor logic circuit is formed by transistors L5, L6, and L7, instead of the four-transistor logic circuit shown in FIG. 4. In particular, transistor L5 has a gate terminal connected to node a, a first terminal connected to inverted data line D#, and a second terminal connected to a gate terminal of transistor L7. Similarly, transistor L6 has a gate terminal connected to node b, a first terminal connected to data line D, and a second terminal connected to a gate terminal of transistor L7. Transistor L7 is connected between match line M and low match line LM (or VSS). During lookup operations, match line M indicates match or no-match conditions similar to that described above with reference to FIG. 4. For example, a high voltage at node a turns on transistor L5, thereby passing the inverted data bit on inverted data line D# to the gate terminal of transistor L7. If this inverted data bit is also high, then transistor L7 is turned on and match line M is discharged, thereby indicated a no-match condition. Similarly, a high voltage at node b turns on transistor L6, thereby passing the data bit on data line D to the gate terminal of transistor L7. If the true data bit is also high, then transistor L7 is turned on and match line M is discharged, thereby indicated a no-match condition. Because the lookup operation is performed using only three transistors (instead of four), each CAM cell 125B may be formed using less area than CAM cells 125A (FIG. 4), thereby reducing the size of CAM array 120B.

Figure 7:
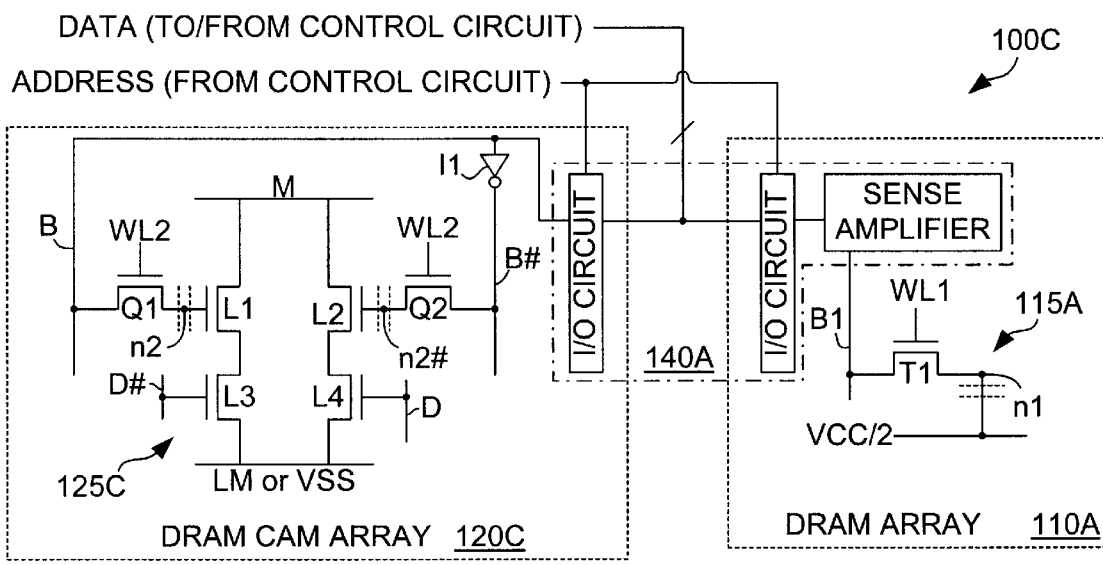
FIG. 7 is a simplified schematic diagram showing a portion of a binary CAM circuit according to a third specific embodiment of the present invention.

FIG. 7 is a simplified schematic diagram showing a portion of a binary CAM circuit 100C including DRAM 110A, which is described above with reference to FIG. 4, and a DRAM-based CAM array 120C. DRAM-based CAM array 120C includes a logic circuit formed by transistors L1 through L4 that operates in essentially the same manner as the logic circuit described above with reference to FIG. 4. However, DRAM-based CAM array 120C differs from the embodiment shown in FIG. 4 in that DRAM-based CAM cells 125C (one shown) store data values at nodes n2 and n2#, which have respective intrinsic capacitances formed in accordance with known DRAM techniques. In particular, a data value written on bit line B is passed to node n2 by turning on access transistor Q1, where it remains stored for a period of time. Similarly, an inverted data value written on bit line B# is passed to node n2# by turning on access transistor Q2. The data values stored at nodes n2 and n2# are compared with data values transmitted on data lines D and D# in the manner described above. A disadvantage of binary CAM circuit 100C is that CAM array 120C may require additional I/O terminals to support refresh operations originating in DRAM array 110A. However, a corresponding advantage provided by binary CAM circuit 100C is that, because CAM cells 125C are refreshed each cycle by corresponding DRAM cells 115A, binary CAM array 120C may be simplified by omitting an independent refresh circuit. Further, DRAM array 110A may be formed using higher voltage/higher capacitance DRAM cells to prevent soft errors, while DRAM CAM array 120C may be formed using low voltage DRAM cells to minimize power consumption.

Figure 8:
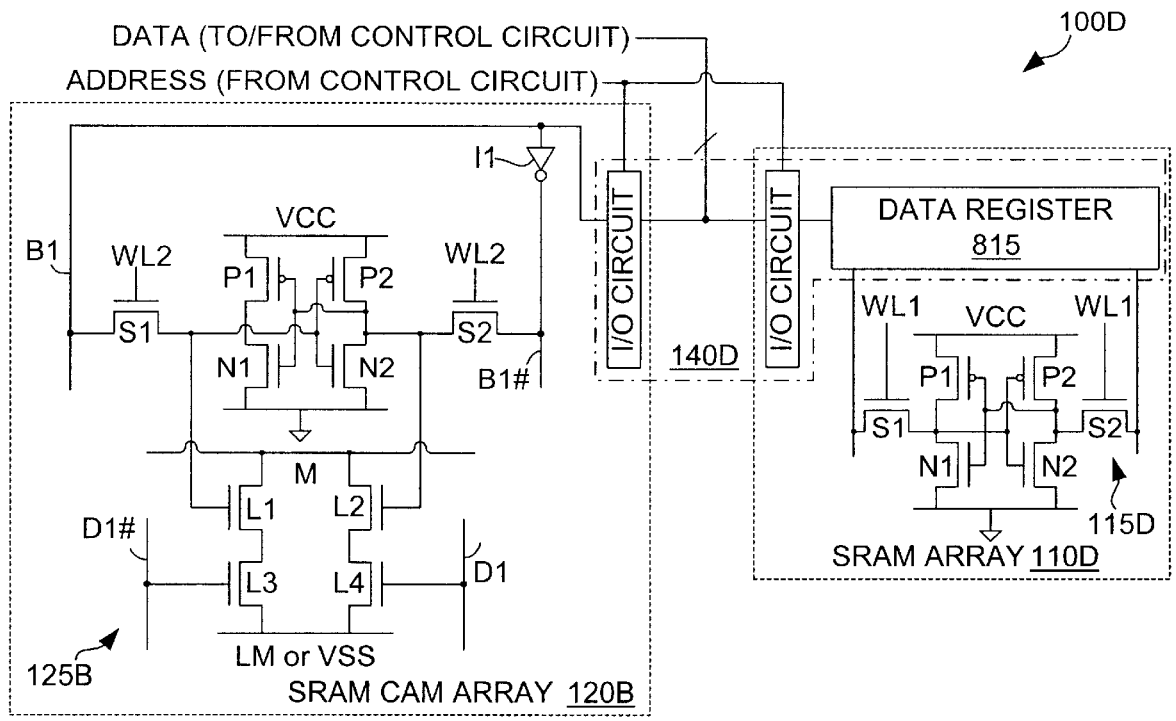
FIG. 8 is a simplified schematic diagram showing a portion of a binary CAM circuit according to a fourth specific embodiment of the present invention.

FIG. 8 is a simplified schematic diagram showing yet another binary CAM circuit 100D including SRAM-based CAM array 120B, which is described above with reference to FIG. 5, and an SRAM array 110D, which includes a series of SRAM cells 115D (one shown) arranged in rows and columns. An interface circuit 140D includes a data register 815 for reading data values from SRAM cells 115D, and I/O circuits similar to those described above. SRAM array 110D has an advantage over DRAM array 110A (described above) in that SRAM cells 115D do not require periodic refreshing, thereby allowing more flexibility in refreshing CAM array 120B. CAM circuit 110D may be more expensive than the DRAM-based circuits discussed above, but SRAM arrays are typically faster than DRAM arrays (discussed above), thereby allowing more frequent refreshing of CAM array 120B.

Figure 9:
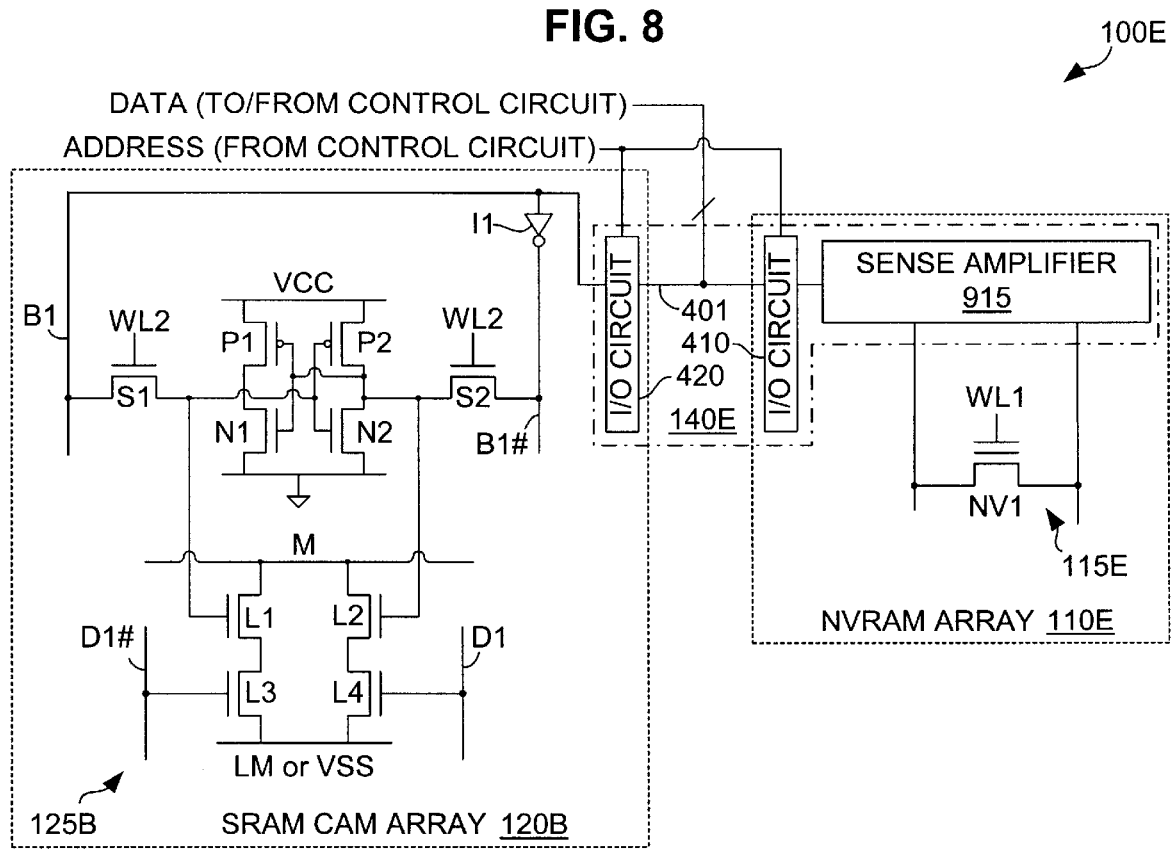
FIG. 9 is a simplified schematic diagram showing a portion of a binary CAM circuit according to a fifth specific embodiment of the present invention.

FIG. 9 is a simplified schematic diagram showing yet another binary CAM circuit 100E including SRAM-based CAM array 120B, which is described above with reference to FIG. 5, and an NVRAM array 110E, which includes a series of floating gate NVRAM cells 115E (one shown) arranged in rows and columns. An interface circuit 140E includes a data register 915 for reading data values from NVRAM cells 115E, and I/O circuits similar to those described above. NVRAM array 111E has an advantage over DRAM array 110A and SRAM array 110D (described above) in that NVRAM cells 115E maintain data values if system power is interrupted, thereby facilitating convenient and rapid recovery of CAM system 100E. In addition, NVRAM cells are typically smaller than SRAM cells. However, NVRAM cells typically take longer to write than SRAM or DRAM cells, so the use of CAM circuit 100E may be limited to systems requiring infrequent updating, such as inventory applications where data is updated once a day.

The present invention also extends to ternary and quad CAM circuits, as exemplified by the embodiments described below with reference to FIGS. 10 and 11. Although the following embodiments are SRAM-based, it is understood that these embodiments may also be constructed using the various technologies described above.

Figure 10:
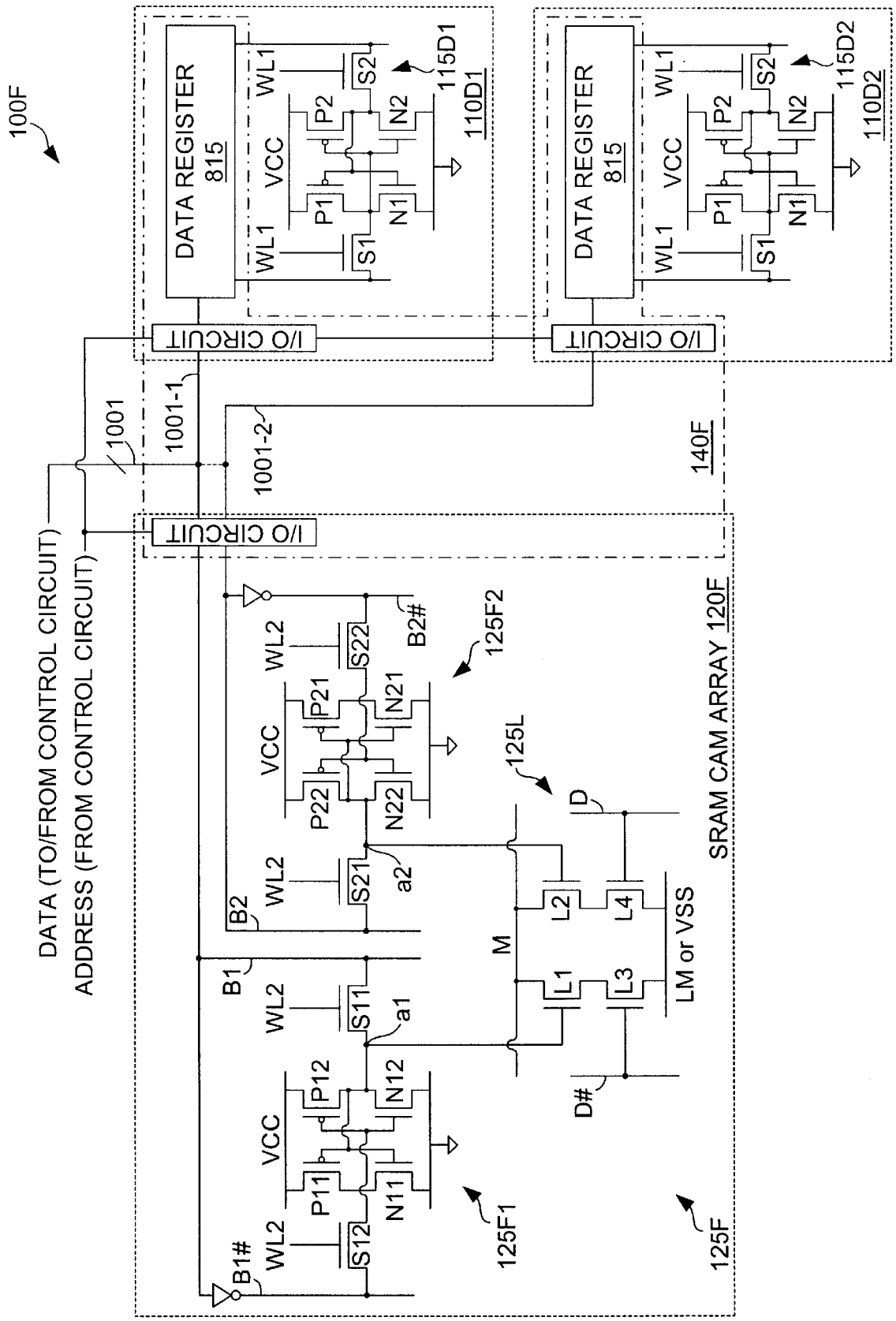
FIG. 10 is a simplified schematic diagram showing a portion of a ternary CAM circuit according to a sixth specific embodiment of the present invention.

FIG. 10 is a simplified circuit diagram showing portions of a ternary CAM circuit 100F in accordance with a sixth specific embodiment of the present invention. Ternary CAM circuit 100F includes a first SRAM array 110D1, a second SRAM array 110D2, and a ternary SRAM CAM array 120F, which are connected to a control circuit (not shown) by a bus 1001. An interface circuit 140F is formed by two data registers 815 and I/O circuits, one each per SRAM array 110D1 and 110D2, and an I/O circuit provided in CAM array 120F, which operate in a manner similar to the embodiments described above.

Referring to the right side of FIG. 10, each SRAM array 110D1 and 110D2 includes an array of conventional SRAM memory cells 115D (one shown) that are arranged in rows and columns (as shown in FIG. 2), and operate in the manner described above with reference to FIG. 8. SRAM array 110D1 transmits data values on a first set of bus lines 1001-1 (one shown) of bus 1001, and SRAM array 110D2 transmits data values on a second set of bus lines 1001-2 (one shown) of bus 1001. Accordingly, during a single refresh cycle, CAM array 120F receives a first data value transmitted from SRAM cell 115D1 and a second data value transmitted from SRAM cell 115D2, as described below.

Referring to the left portion of FIG. 10, ternary CAM array 120F includes an array of SRAM CAM cells 125F (one shown) that are arranged in rows and columns. Each SRAM CAM cell 125F includes a first SRAM cell 125F1, a second SRAM cell 125F2, and a logic circuit 125L. First SRAM cell 125F1 includes a bistable flipflop formed by transistors P11, P12, N11 and N12, and is connected to bit lines B1 and B1# by access transistors S11 and S12, respectively. A first data value received from bus line 1001-1 is passed on bit line B1 to first SPAM cell 125F1, and is stored at a node a1. Second SRAM cell 125F2 includes a bistable flipflop formed by transistors P21, P22, N21 and N22, and is connected to bit lines B2 and B2# by access transistors S21 and S22, respectively. A second data value received from bus line 1001-2 is passed on bit line B2 to second SRAM cell 125F2, and is stored at node a2. Logic circuit 125L includes transistors L1 through L4 that operate in the manner described above. However, instead of being controlled by a single SRAM cell, as in the bistable embodiments described above, node a1 of SRAM cell 125F1 is connected to the gate terminal of transistor L1, and node a2 of SRAM cell 125F2 is connected to the gate terminal of transistor L2.

Operation of ternary CAM circuit 100F is similar to that described above with reference to the various binary CAM circuits in that each CAM cell 125F is refreshed during a write phase of a refresh operation using the two data values read from associated SRAM memory cells 115D1 and 115D2 during a read phase of the refresh operation. In particular, to refresh CAM cell 125F, data values are read from associated SRAM memory cells 115D1 and 115D2, and passed to interface circuit 140F by enabling word line WL1. After registering the respective data values and passing the data values to bit lines B1 and B2 of CAM array 120F, word line WL2 is turned on, thereby passing the data values to storage nodes a1 and a2, respectively. After predetermined set-up periods, word lines WL1 and WL2 are disabled, thereby isolating SRAM cells 115D1, 115D2, 125F1 and 125F2 from their respective bit lines.

While the above-described refresh operation is systematically performed, lookup operations are also performed using applied data values transmitted to ternary CAM cell 125F on data lines D and D#. With match line M and the low match line LM pre-charged in the manner described above, an applied data value (and its inverse) is transmitted on data line D (and inverted data line D#). The lookup operation performed by ternary CAM cell 125F differs from that of binary CAM cells (described above) in that the two data values stored in SRAM cells 115D1 and 115D2 facilitate a "don't care" lookup operation in CAM cell 125F. As described above, binary CAM cells, such as that described above with reference to FIG. 4, store a logic "1" (high voltage) value in at least one of the storage nodes n2 and n2#, so one of transistors L1 and L2 is always turned on during a lookup operation. Ternary CAM cell 125F operates in a similar manner to store logic "1" (e.g., 1,0) and logic "0" (e.g., 0,1) data values, but is also capable of storing a "don't care" value in which both storage nodes a1 and a2 store logic "0". Specifically, when CAM cell 125F stores either a logic "1" data value or a logic "0" data value, at least one of storage nodes a1 and a2 are held at a high voltage level during the match operation, thereby opening one of transistors L1 and L2, and allowing match line M to discharge to low match line LM when the applied data value turns on a corresponding transistor L3 or L4. However, when a "don't care" logic value is transmitted to CAM cell 125F during the refresh operation, both storage nodes a1 and a2 are maintained at low voltage (e.g., ground) levels, thereby preventing the discharge of match line M irrespective of the applied data value. Subsequent operation of CAM array 120F is similar to that described above.

Figure 11:
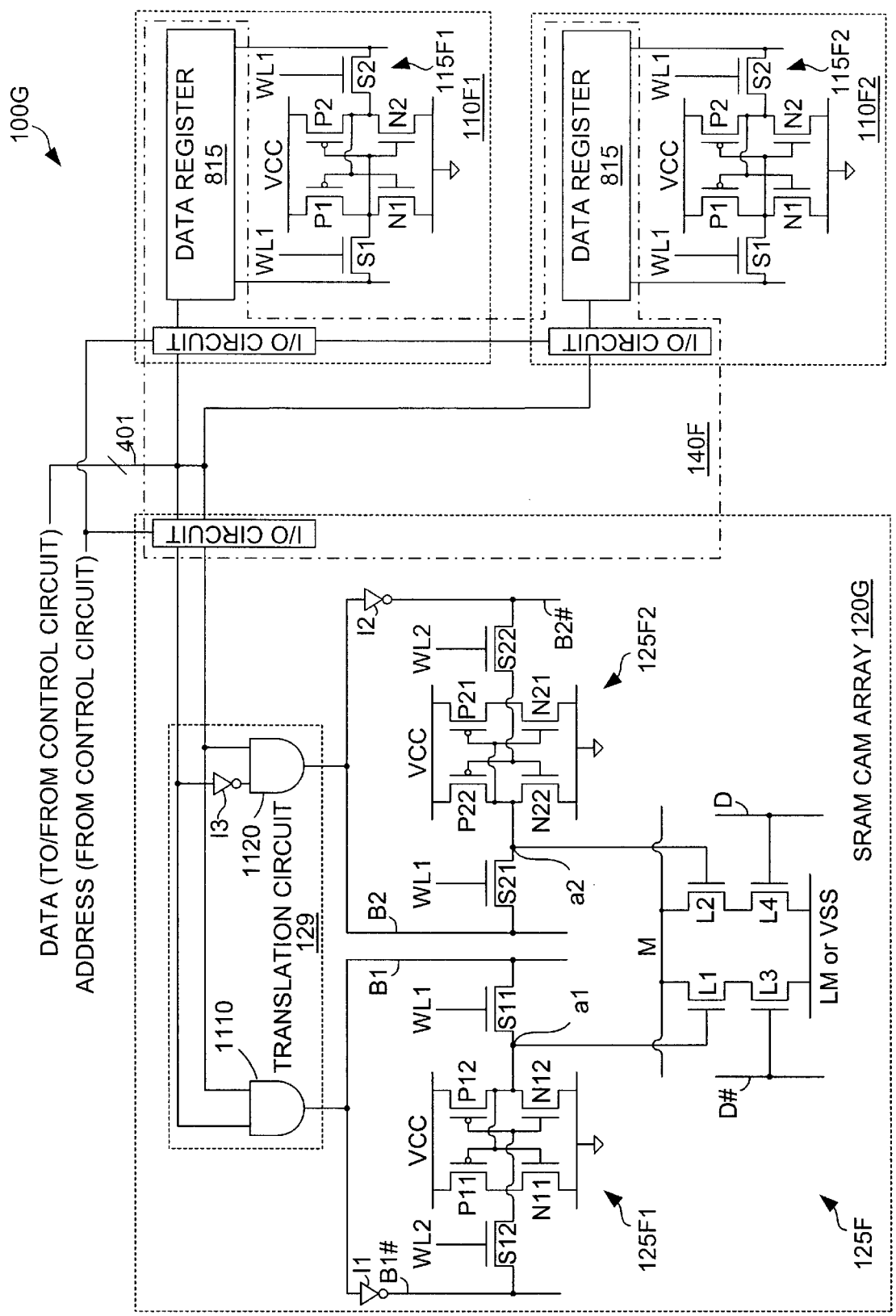
FIG. 11 is a simplified schematic diagram showing a portion of a quad CAM circuit according to a seventh specific embodiment of the present invention.

FIG. 11 is a simplified circuit diagram showing portions of a quad (i.e., four state) CAM circuit 100G in accordance with a seventh specific embodiment of the present invention. Quad CAM circuit 100G includes SRAM arrays 110D1 and 110D2, which are described above with reference to ternary CAM circuit 100F (shown in FIG. 10), and a quad CAM array 120G. Quad CAM array 120G includes an array of quad CAM cells 120F, also described above with reference to FIG. 10, and a translation circuit 129 for translating the data values read from SRAM arrays 110D1 and 110D2 to support quad CAM cell operations in the manner described below. As in previous examples, portions of CAM circuit 100G that are not required for explanatory purposes are omitted for brevity.

In general, quad CAM cells differ from ternary CAM cells in that ternary CAM cells store don't care (e.g., 0,0) data values, whereas quad CAM cells store logic low don't care data values (e.g., 0,0) and logic high don't care data values (e.g., 1,1). These distinct don't care values allow a quad CAM cell to retain a logic value (logic "1" or logic "0") even though it is designated as "don't care" during lookup operations. For example, referring to CAM cell 125F, a logic high value (e.g., 1,0) stored at nodes a1 and a2 will turn on transistor L1 (transistor L2 remains turned off). If a subsequent logic low data value (e.g., 0,1) is transmitted on data line D and inverted data line D#, then transistor L3 is turned on, discharging match line M through transistors L1 and L3. When a don't care logic value is stored in CAM cell 125F, both transistors L1 and L2 remain turned off, thereby precluding a no-match condition. However, in quad CAM cells, if the logic high don't care data values (1,1) is written into CAM cell 125F, then both transistors L1 and L2 would be turned on, thereby generating a no-match condition no matter what data value is applied to data lines D and D#.

Translation circuit 127 is provided to avoid the problem associated with storing a logic high don't care data values (1,1) in CAM cell 125F. Specifically, translation circuit 129 includes a first AND gate 1110, a second AND gate 1120, and an inverter 13 that are connected to bit lines B1 and B2 to translate the data values, which are read from SRAM cells 115D1 and 115D2, into data values stored at storage nodes a1 and a2 of SRAM cells 125F1 and 125F2 according to Table 1, provided below.

TABLE 1

| 115D1 | 115D2 | 125F1 | 125F2 |
|-------|-------|-------|-------|
| 0     | 0     | 0     | 0     |
| 1     | 0     | 0     | 0     |
| 1     | 1     | 1     | 0     |
| 0     | 1     | 0     | 1     |

According to the translations provided in Table 1, each time a logic high don't care (1,0) or a logic low (0,0) don't care data value is written to CAM cell 125F, translation circuit 129 converts these data values into don't care (0,0) data value, thereby preventing a no-match condition during the subsequent application of a data value on data lines D and D#. Note that when the logic high don't care or logic low don't care data value is required, this data value is read from SRAM cells 115F1 and 115F2 using known techniques. Those of ordinary skill in the art will recognize that the logic performed by translation circuit 129 can be implemented using other types of logic gates and other data values stored in SRAM cells 115F1 and 115F2. Accordingly, the circuit structure shown in FIG. 11 is merely exemplary, and is not intended to be limiting.

Although the present invention is described with reference to two DRAM arrays formed on a single "chip", the two DRAM arrays (e.g., first DRAM array 110 and second DRAM array 120) can be fabricated separately and then combined using mulit-chip module (MCM) packaging. In view of these and other possible modifications, the invention is limited only by the following claims.

What is claimed is:

1. A content addressable memory (CAM) circuit comprising:
   a random access memory (RAM) array including a first memory cell;
   a CAM array including a CAM cell, wherein the CAM cell includes a second memory cell; and
   a control circuit connected to the RAM array and the CAM array for systematically refreshing the CAM array by reading a data value from the first memory cell, and then writing the data value to the second memory cell.

2. The CAM circuit according to claim 1, wherein the RAM array and the CAM array are fabricated on a single substrate.

3. The CAM circuit according to claim 1, wherein the RAM array and the CAM array are fabricated on separate substrates that are mounted in a single package.

4. The CAM circuit according to claim 1, wherein the RAM array and the CAM array are fabricated on separate substrates that are mounted on a printed circuit board.

5. The CAM circuit according to claim 1, wherein CAM cell is a binary CAM cell including the second memory cell and a logic circuit.

6. The CAM circuit according to claim 5,
   wherein the logic circuit includes a first transistor, a second transistor, a third transistor and a fourth transistor, the first transistor being connected in series with the third transistor between a match line and a discharge line, and the second transistor being connected in series with the fourth transistor between the match line and the discharge line,
   wherein the second memory cell comprises an SRAM cell including a first node connected to a gate terminal of the first transistor, and a second node connected to a gate terminal of the second transistor, and
   wherein gate terminals of the third and fourth transistors are connected to complementary data lines.

7. The CAM circuit according to claim 5,
   wherein the logic circuit includes a first transistor, a second transistor, and a third transistor, the first transistor being connected between a first data line and a gate terminal of the third transistor, the second transistor being connected between a second data line and the gate terminal of the third transistor, and the third transistor being connected between a match line and a discharge line,
   wherein the second memory cell comprises an SRAM cell including a first node connected to a gate terminal of the first transistor, and a second node connected to a gate terminal of the second transistor, and
   wherein first and second data lines are complementary data lines.

8. The CAM circuit according to claim 5, wherein the second memory cell of the CAM CELL comprises a DRAM cell.

9. The CAM circuit according to claim 5, wherein the first memory cell comprises a DRAM cell.

10. The CAM circuit according to claim 5, wherein the first memory cell comprises an SRAM cell.

11. The CAM circuit according to claim 5, wherein the first memory cell comprises a non-volatile RAM cell.

12. The CAM circuit according to claim 1, wherein the translation circuit includes a first logic gate having a first input terminal connected to receive a first data value from the first RAM cell, and a second data value from the second RAM cell, and a second logic gate having a first input terminal connected to receive the first data value from the first RAM cell, and the second data value from the second RAM cell,
   wherein the second memory cell comprises a first SRAM cell connected to an output terminal of the first logic gate,
   wherein the fourth memory cell comprises a second SRAM cell connected to an output terminal of the second logic gate.

13. The CAM circuit according to claim 12,
   wherein the logic circuit includes a first transistor, a second transistor, a third transistor and a fourth transistor, the first transistor being connected in series with the third transistor between a match line and a discharge line, and the second transistor being connected in series with the fourth transistor between the match line and the discharge line,
   wherein the first SRAM cell includes a first node connected to a gate terminal of the first transistor,
   wherein the second SRAM cell includes a second node connected to a gate terminal of the second transistor, and
   wherein gate terminals of the third and fourth transistors are connected to complementary data lines.

14. The CAM circuit according to claim 1, further comprising a second RAM array including a third memory cell,
   wherein the CAM cell is a quad CAM cell including the second memory cell, a fourth memory cell, a logic circuit, and a translation circuit.

15. The CAM circuit according to claim 1, further comprising a second RAM array including a third memory cell, wherein the CAM cell is a ternary CAM cell including the second memory cell, a fourth memory cell, and a logic circuit.

16. The CAM circuit according to claim 15,
- wherein the logic circuit includes a first transistor, a second transistor, a third transistor and a fourth transistor, the first transistor being connected in series with the third transistor between a match line and a discharge line, and the second transistor being connected in series with the fourth transistor between the match line and the discharge line,
- wherein the second memory cell comprises an SRAM cell including a first node connected to a gate terminal of the first transistor,
- wherein the fourth memory cell comprises an SRAM cell including a second node connected to a gate terminal of the second transistor, and
- wherein gate terminals of the third and fourth transistors are connected to complementary data lines.

17. The CAM cell according to claim 15, wherein the second and fourth memory cells comprise one of an SRAM cell, a DRAM cell, and a non-volatile RAM cell.

18. The CAM cell according to claim 15, wherein the first and third memory cells comprise one of an SRAM cell, a DRAM cell, and a non-volatile RAM cell.

19. The CAM cell according to claim 15, wherein the second and fourth memory cells comprise one of an SRAM cell, a DRAM cell, and a non-volatile RAM cell.

20. The CAM cell according to claim 15, wherein the first and third memory cells comprise one of an SRAM cell, a DRAM cell, and a non-volatile RAM cell.

21. A content addressable memory (CAM) circuit comprising:
- a random access memory (RAM) array including a first memory cell;
- a CAM array including a CAM cell, wherein the CAM cell includes a second memory cell; and
- means for systematically refreshing the CAM array by reading a data value from the first memory cell, and then writing the data value to the second memory cell.

22. A method for operating a content addressable memory (CAM) circuit including a random access memory (RAM) array having a first memory cell, and a CAM array having a second memory cell, the method comprising:
- writing a data value to the first memory cell of the RAM array and to the second memory cell of the CAM array; and
- systematically refreshing the CAM array by reading the data value from the first memory cell, and then writing the data value to the second memory cell.

* * * * *